(12) United States Patent
Uzoh et al.

(10) Patent No.: US 10,672,654 B2
(45) Date of Patent: Jun. 2, 2020

(54) MICROELECTRONIC ASSEMBLY FROM PROCESSED SUBSTRATE

(71) Applicant: Invensas Bonding Technologies, Inc., San Jose, CA (US)

(72) Inventors: Cyprian Emeka Uzoh, San Jose, CA (US); Laura Wills Mirkarimi, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/849,325

(22) Filed: Dec. 20, 2017

(65) Prior Publication Data

US 2018/0182666 A1 Jun. 28, 2018

Related U.S. Application Data

(60) Provisional application No. 62/439,746, filed on Dec. 28, 2016, provisional application No. 62/439,762, filed on Dec. 28, 2016.

(51) Int. Cl.
*H01L 21/768* (2006.01)
*H01L 21/3213* (2006.01)
(Continued)

(52) U.S. Cl.
CPC ...... *H01L 21/76868* (2013.01); *B24B 37/042* (2013.01); *B81B 7/0006* (2013.01); *B81C 1/00095* (2013.01); *C23F 3/00* (2013.01); *H01L 21/30625* (2013.01); *H01L 21/31111* (2013.01); *H01L 21/3212* (2013.01); *H01L 21/32134* (2013.01); *H01L 21/32135* (2013.01); *H01L 21/7684* (2013.01); *H01L 21/76883* (2013.01); *H01L 24/80* (2013.01); *H01L 24/81* (2013.01); *C23F 1/18* (2013.01); *H01L 21/76898* (2013.01); *H01L 23/5226* (2013.01); *H01L 24/05* (2013.01); *H01L 24/08* (2013.01); *H01L 24/13* (2013.01); *H01L 24/16* (2013.01); *H01L 25/0657* (2013.01); *H01L 2224/05647* (2013.01); *H01L 2224/08145* (2013.01); *H01L 2224/08225* (2013.01); *H01L 2224/16145* (2013.01); *H01L 2224/16225* (2013.01); *H01L 2224/80031* (2013.01); *H01L 2224/80895* (2013.01);
(Continued)

(58) Field of Classification Search
None
See application file for complete search history.

(56) References Cited

U.S. PATENT DOCUMENTS

2018/0102286 A1* 4/2018 Uzoh .................. H01L 21/3212

* cited by examiner

*Primary Examiner* — Long Pham

(57) ABSTRACT

Representative implementations of techniques, methods, and formulary provide repairs to processed semiconductor substrates, and associated devices, due to erosion or "dishing" of a surface of the substrates. The substrate surface is etched until a preselected portion of one or more embedded interconnect devices protrudes above the surface of the substrate. The interconnect devices are wet etched with a selective etchant, according to a formulary, for a preselected period of time or until the interconnect devices have a preselected height relative to the surface of the substrate. The formulary includes one or more oxidizing agents, one or more organic acids, and glycerol, where the one or more oxidizing agents and the one or more organic acids are each less than 2% of formulary and the glycerol is less than 10% of the formulary.

15 Claims, 4 Drawing Sheets

(A)

(B)

(51) Int. Cl.
*H01L 21/306* (2006.01)
*H01L 23/00* (2006.01)
*H01L 21/321* (2006.01)
*B24B 37/04* (2012.01)
*C23F 3/00* (2006.01)
*H01L 21/311* (2006.01)
*B81B 7/00* (2006.01)
*B81C 1/00* (2006.01)
C23F 1/18 (2006.01)
H01L 25/065 (2006.01)
H01L 23/522 (2006.01)

(52) U.S. Cl.
CPC ............... *H01L 2225/06506* (2013.01); *H01L 2225/06524* (2013.01); *H01L 2924/14* (2013.01); *H01L 2924/1433* (2013.01)

MICROELECTRONIC ASSEMBLY FROM PROCESSED SUBSTRATE

PRIORITY CLAIM AND CROSS-REFERENCE TO RELATED APPLICATION

This application claims the benefit under 35 U.S.C. § 119(e)(1) of U.S. Provisional Application No. 62/439,762, filed Dec. 28, 2016, and U.S. Provisional Application No. 62/439,746, filed Dec. 28, 2016 which is hereby incorporated by reference in its entirety.

FIELD

The following description relates to processing of integrated circuits ("ICs"). More particularly, the following description relates to techniques for repairing processed substrates.

BACKGROUND

Semiconductor chips are fabricated on suitable flat substrate wafers, such as GaAs, diamond coated substrates, silicon carbide, silicon wafers, etc. After making the active devices, a series of steps are performed to connect the various devices with highly conducting wiring structures, so they can have communication with each other to perform logic or memory storage operations. These wiring structures or interconnect structures are essentially a skeletal network of conducting materials, typically metals, in a matrix of dielectric materials. In high performance devices and to improve device density and yield, it is desirable to minimize topographic features within the interconnect layers for any given device and across the entire substrate. One common method of forming these high-performance interconnect layers is the damascene process.

Multiple types of damascene structures are known, however single and dual damascene processes are the most common. In single damascene, each metal or via layer is fabricated in a series of operations, while in dual damascene, a metal level and a via level are fabricated in a similar operation. Of these two, the dual damascene technique is often preferred because of lower cost and higher device performance.

In the dual damascene process, a suitable substrate with or without devices is coated with a suitable resist layer. The resist layer is imaged to define desirable patterns by lithographic methods on the substrate. Cavities are etched on the patterned substrates typically by reactive ion etching (RIE) methods. The patterned substrate is then coated with a suitable barrier/seed layer prior to overfilling the cavities with a suitable metal, typically copper, by electro-deposition from super-filling plating bath chemistry. After subjecting the coated substrate to a thermal treatment process, the coated conductive layer on the substrate is planarized to remove any unwanted conductive layers. During the planarization step, portions of the underlying dielectric layer may also be removed.

The damascene process is repeated to form the many layers of interconnects. As a result of the discontinuity in the properties (difference in mechanical properties, polishing rates, etc.) of the interconnect metal and the surrounding insulator material, and their respective interactions with the polishing pad, polishing slurry, and other process parameters, erosion forms in areas of high metal pattern density features and dishing forms in large metal structures. The higher the metal pattern density, the greater the erosion, and similarly, the larger the size (e.g., area) of the metal structure, the greater the dishing defect. These deleterious defects can be problematic for manufacturing complex structures, causing shorting defects in subsequent levels, and reducing device yield.

Similar results are observed in cross section topographic profiles of polished through silicon via (TSV) structures. The centers of the vias are often typically lower than the surface of the insulators, due to the dishing effects described.

One of the consequences of substrate surface dishing is poor flatness of the surface of the substrate and its interconnects. This can cause much higher pressures to be needed for bonding devices, dies, wafers, substrates, or the like, using so called hybrid bonding techniques. For example, dies and/or wafers may be bonded in a stacked arrangement using various bonding techniques, including direct bonding, non-adhesive techniques known as ZiBond® or a hybrid bonding technique, also known as DBI®, both available from Invensas Bonding Technologies, Inc., a Xperi company (see for example, U.S. Pat. Nos. 6,864,585 and 7,485,968, which are incorporated herein in their entirety). These bonding techniques, and other similar techniques, require extremely flat bonding surfaces for the most reliable and the best performing bonds.

Attempts to reduce the impact of these defects have included the incorporation of dummy dielectric or metal features in the layout of the design of device interconnects. This approach has been helpful, but it has also increased mask design complexity and the associated loss of freedom of structure placement on the modified pads.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Figure 1:
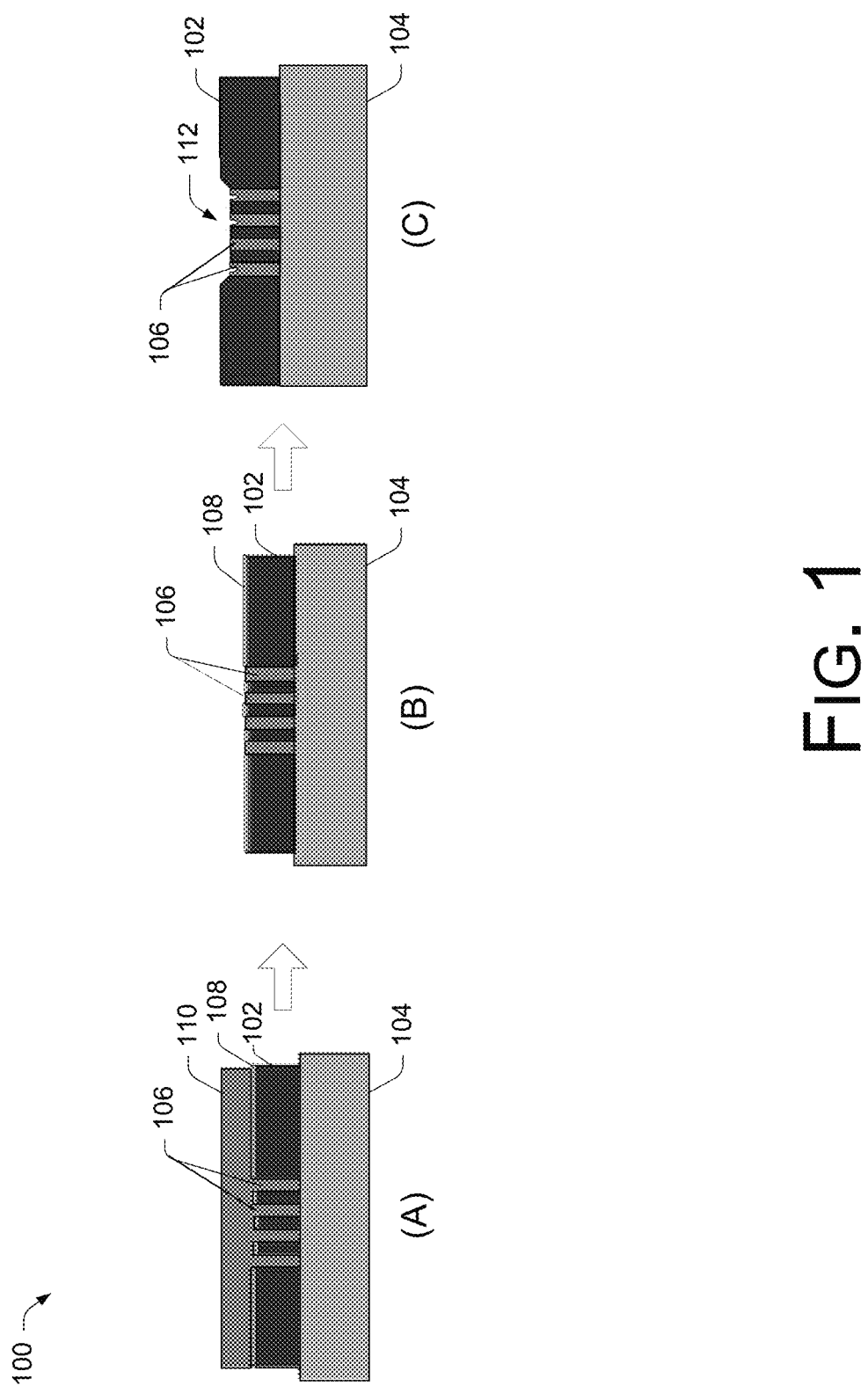
FIG. 1 is a schematically illustrated block flow diagram illustrating an example substrate processing sequence and the resulting dishing of the substrate.

Various embodiments of methods and techniques for repairing processed semiconductor substrates, and forming associated devices and assemblies, are disclosed. The embodiments comprise methods to remedy and/or to take advantage of the erosion or "dishing" resulting from chemical mechanical polishing/planarizing (CMP) of the substrates, and particularly at locations where there is a higher density of metallic structures embedded within the substrates. In some embodiments, unique formularies are used to carry out the described methods and techniques.

In various implementations, example processes include dry etching the surface of the substrate, until a preselected portion of the conductive material protrudes from the cavities above the surface of a recessed region in the surface of the substrate. In some embodiments, a first selective etchant (a wet etchant) may also be applied to etch the surface of the substrate, forming a smooth flat surface, without damaging the metallic interconnect structures.

In some implementations, the example processes include selectively wet etching the conductive material protruding from the cavities, including applying a second selective etchant to the conductive material for a preselected period of time or until an end point of the conductive material has a preselected height relative to the surface of the substrate. In various embodiments, the second selective etchant is formulated to remove the conductive material, without roughening the smooth surface of the substrate.

A second substrate with similar interconnect structures may be bonded to the substrate, with the interconnects of each of the substrates making contact and electrically coupling. The coupled interconnects form pass-through conductive interconnections through both substrates.

In an example implementation, the first selective etchant comprises a source of fluoride ions, one or more organic acids, and glycerol, with or without a complexing agent, where a content of the source of fluoride ions is less than 2% of the formulary, a content of the one or more organic acids is less than 2% of the formulary, and a content of the glycerol is less than 10% of the formulary. In another example implementation, the second selective etchant comprises one or more oxidizing agents, one or more organic acids, and glycerol, where the one or more oxidizing agents and the one or more organic acids are each less than 2% of formulary. The oxidizing agent may be organic or inorganic material or both, and in some embodiments, the acidic chemicals may comprise an organic or an inorganic acid or a combination of both. The glycerol or other suitable agent may slow the etch rate of the substrate, interconnect or other layer without roughening some or all of the surfaces. Thus, by controlling the chemistry, different features and surfaces may be selectively etched, e.g. a dielectric may be selectively etched using one chemistry that does not affect a conductive layer, followed by a conductive material being selectively etched using a slightly different chemistry or process condition so as not to materially affect the dielectric layer.

In an alternate implementation, the first selective etchant and the second selective etchant include a common formulary. In the implementation, combining the common formulary with one or more additives at preselected process stages allows for the etching of dielectric (e.g., the first selective etchant) or the etching of metals (e.g., the second selective etchant) as appropriate for the process stage.

Various implementations and arrangements are discussed with reference to electrical and electronics components and varied carriers. While specific components (i.e., wafers, integrated circuit (IC) chip dies, etc.) are mentioned, this is not intended to be limiting, and is for ease of discussion and illustrative convenience. The techniques and devices discussed with reference to a wafer, die, or any substrate or surface of interest, and the like, are applicable to any type or number of electrical components, circuits (e.g., integrated circuits (IC), mixed circuits, ASICS, memory devices, processors, etc.), groups of components, packaged components, structures (e.g., wafers, panels, glasses, glass-ceramics, boards, PCBs, etc.), and the like, that may be coupled to interface with each other, with external circuits, systems, carriers, and the like. Each of these different components, circuits, groups, packages, structures, and the like, can be generically referred to as a "microelectronic element." For simplicity, such components will also be referred to herein as a "die" or a "substrate."

The disclosed processes are illustrated using block flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of substrate structure and assembly process techniques and related devices are disclosed. The embodiments comprise process techniques to remedy or to utilize the erosion or "dishing" that can result from chemical mechanical polishing/planarizing (CMP) of substrates, and particularly at locations where there is a higher density of metallic structures within the substrates.

A schematically illustrated flow diagram 100 is shown at FIG. 1, illustrating an example substrate processing sequence and the resulting dishing and erosion 112 of the substrate 102. Substrates 102 may include wafers, comprising GaAs or other semiconductors, diamond coated substrates, silicon carbide, silicon wafers, dielectrics, flat panels, glasses, ceramics, circuit boards, packages, interposers, structures with or without an embedded device or devices, and so forth. For clarity, the substrate 102 comprises a surface of interest processed for intimate contact with another surface.

As shown in FIG. 1 at block (A), a substrate 102 is coupled to a carrier 104. The carrier 104 may comprise a semiconductor device, a handle wafer, a glass panel, a backend of the line routing layer, an RDL layer, a wiring structure, etc. Cavities or trenches are formed in the substrate 102 for forming conductive interconnect structures 106, or the like. Some cavities may be blind cavities, where the bottom surface of the cavities contacts the wiring features beneath. In some applications, the cavities may be through-hole cavities. Other cavities are etched in a dielectric material with or without wiring features beneath the cavity.

A barrier metal layer 108 is applied to the surface of the substrate 102, to serve as an adhesive layer and also to prevent diffusion of conductive material into the substrate 102. An electroplating or electroless process (or a combination of both) may be used to fill the cavities in the substrate 102 with a conductive material (such as copper, for example), to form the interconnect structures 106, vias, trenches, combinations of vias and trenches, or the like. The metal filling step commonly leaves an overfill 110 of the conductive material on the surface of the substrate 102 and barrier layer 108.

As shown at block (B), the conductive overfill 110 can be removed (here, to the barrier layer 108), by chemical mechanical polishing (CMP), for example. At block (C), a CMP process is further used to remove the metallic barrier layer 108. As shown at (C), CMP polishing the substrate 102 can result in dielectric erosion and dishing 112 at the location of the interconnect structures 106. For example, depending on the polishing variables, the erosion 112 may be greater than 20 nm in depth for damascene cavities less than 1 micron in depth. Erosion may further be affected by the proximity of adjacent conductive features and interconnect structures 106.

Bonding techniques, such as a direct bond interconnect (DBI) technique, for example, may use pressure and/or heat to bond a substrate 102 to another similar or dissimilar substrate, including bonding the respective interconnects of the substrates. Bonding a substrate 102 with large erosion 112 to another substrate can result in a gap at the location of the erosion 112. In some cases, the gap can be a source of poor bonding between the substrates, and can also cause discontinuity between bonded interconnect structures 106 (the interconnects 106 may be electrically open after bonding). Additionally, bonded substrates 102 with larger erosion 112 and comparatively high dishing typically exhibit poor interfacial bond strength and interconnect 106 reliability.

Example Embodiments

Figure 2:
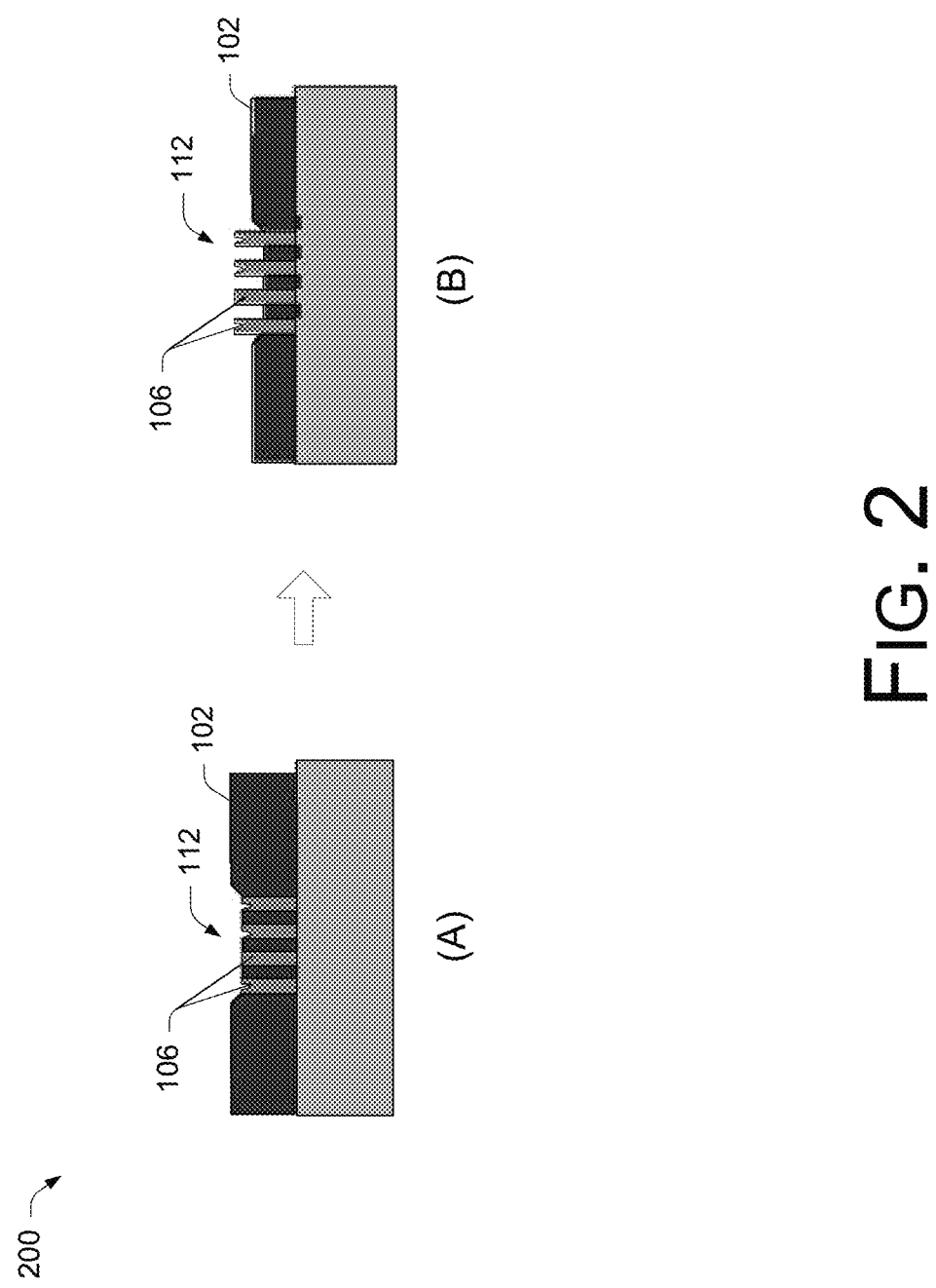
FIG. 2 is a schematically illustrated block flow diagram illustrating an example substrate processing and repair sequence, according to an embodiment.

FIG. 2 is a schematically illustrated flow diagram illustrating an example substrate processing and repair process 200, according to an embodiment. As described with reference to FIG. 1, processing of a substrate 102, including removal of the overfill 110 and the metallic barrier 108 can result in a recess 112, or erosion of the substrate 102 at the location of the interconnects 106. This is also illustrated in FIG. 2, at block (A). Rather than discard the substrate 102 because of the defects, the defective substrate 102 may be repaired or recovered by the corrective methods disclosed herein.

Referring to FIG. 2, at block (B), the eroded surface of the substrate 102 can be selectively etched with a first selective etchant (or another removal process can be used) to reduce the material of the surface of the substrate 102 and to cause the interconnects 106 to protrude above a reduced surface of the substrate 102, or above a surface of the recess 112. For example, the surface of the substrate 102 can be selectively wet or dry etched (e.g., with the first selective etchant), using the interconnects 106 as an indicator of a stopping point. This can form a substantially planar surface on the substrate 102, with the interconnects 106 protruding a preset distance from the surface of the substrate 102 or above a surface of the recess 112 without protruding above the surface of the substrate 102. The substrate 102 surface may be partially and selectively etched using a dry or wet etch method, for example. Regardless of the method of the partial removal step, it is desirable for the removal process to avoid degrading the smoothness of the top surface of the substrate 102 (e.g., increasing the roughness of the surface of the substrate 102).

Referring again to FIG. 2, at blocks (A) and (B), a first wet selective etchant may be used to selectively etch the surface of the substrate 102 without roughening the metallic interconnects 106, and without roughening the new etched surface of the substrate 102. In an embodiment, the first selective etchant does not substantially affect the roughness of the surface of the substrate 102, particularly the flatness/smoothness (nano-scale topography) of the surface. In some embodiments, after removing portions of the substrate 102, the resulting surface roughness is less than 2 nm, and in other cases less than 0.5 nm. In an embodiment, the removal of substrate 102 material is a function of time, that is, the longer the selective etchant is allowed to contact the surface of the substrate 102, the more material of the substrate 102 is removed. Accordingly, the first selective etchant is applied for a specified period of time.

In an implementation, the first selective etchant comprises glycerated diluted hydrofluoric acid or buffered hydrofluoric acid or ammonium fluoride, organic acid, and deionized water, with or without a stabilizing additive. In some formulary, a first selective etchant for the substrate 102 may comprise an inorganic or organic acid containing a fluoride ion. It is preferable that the content of the fluoride ion be less 2% and preferably less than 0.5% and preferably less than 0.1%. Examples of the sources of fluoride ions may include hydrofluoric acid, buffered oxide etch, ammonium fluoride, or tetrabutylammonium fluoride. The first selective etchant solution may also comprise aliphatic or non-aliphatic organic acids, and more than one organic acid may be used in the formulary. The organic acid content of the first selective etchant may typically be less than 2% and preferably less than 1%, and preferably less than 0.1%. Examples of organic acid may include formic acid, acetic acid, methyl sulfonic acid and their likes. In some embodiments, mineral acids (for example, a very small amount of sulfuric acid) may be used. However, the amount used should not roughen the surface of the etched metallic interconnect 106.

In various embodiments, glycerol is incorporated into the first selective etchant, where the content of glycerol may vary between 0.5 to 25% of the formulary, and preferably under 10%. In other applications, a very small amount of amide, amines, butylated hydroxyanisole (BHA), butylated hydroxytoulene, or organic carbonates may be added to the formulary. In other embodiments, the first selective etchant may be mildly alkaline with a pH preferably less than 9.5 and preferably less than 8.5. It is preferable that the total content of these additional additives be less than 5% and preferably less than 1%. It is also desirable that a complexing agent that suppresses the removal or etching or roughening of the surface of the metallic interconnect 106 be incorporated into the formulary. In the case of copper, for example, a suitable copper complexing agent with one or more triazole moieties may be used. The concentration of the complexing agent is desired to be less than 2%, and preferably less than 1%, 0.2%, and less than 100 ppm and less than 5 ppm in some instances. In some applications, after the selective removal of material of the substrate 102, the complexing agent on the surface of the interconnect 106 may be removed with a suitable solvent, for example an alcohol, such as methanol. In other instances, the complexing agent may be removed from the surface of the interconnect 106 by a radiation method or by a thermal treatment to sublime the complexing agent from the surface of the interconnect 106.

In some embodiments, the application of a complexing agent may not be desirable. In such an embodiment, the first etchant can be de-oxygenated to remove undesirable oxygen content from the fluid. Dissolved gasses in the first selective etchant may be removed by a membrane process, for example, using 3M Corporation® Liqui-Cel™ Membrane Contactor or Contactors, or the like. Removing dissolved oxygen and carbon dioxide from the first selective etchant increases the selectivity of the removal rate of the material of the substrate 102 with respect to the interconnect structures 106.

Figure 4:
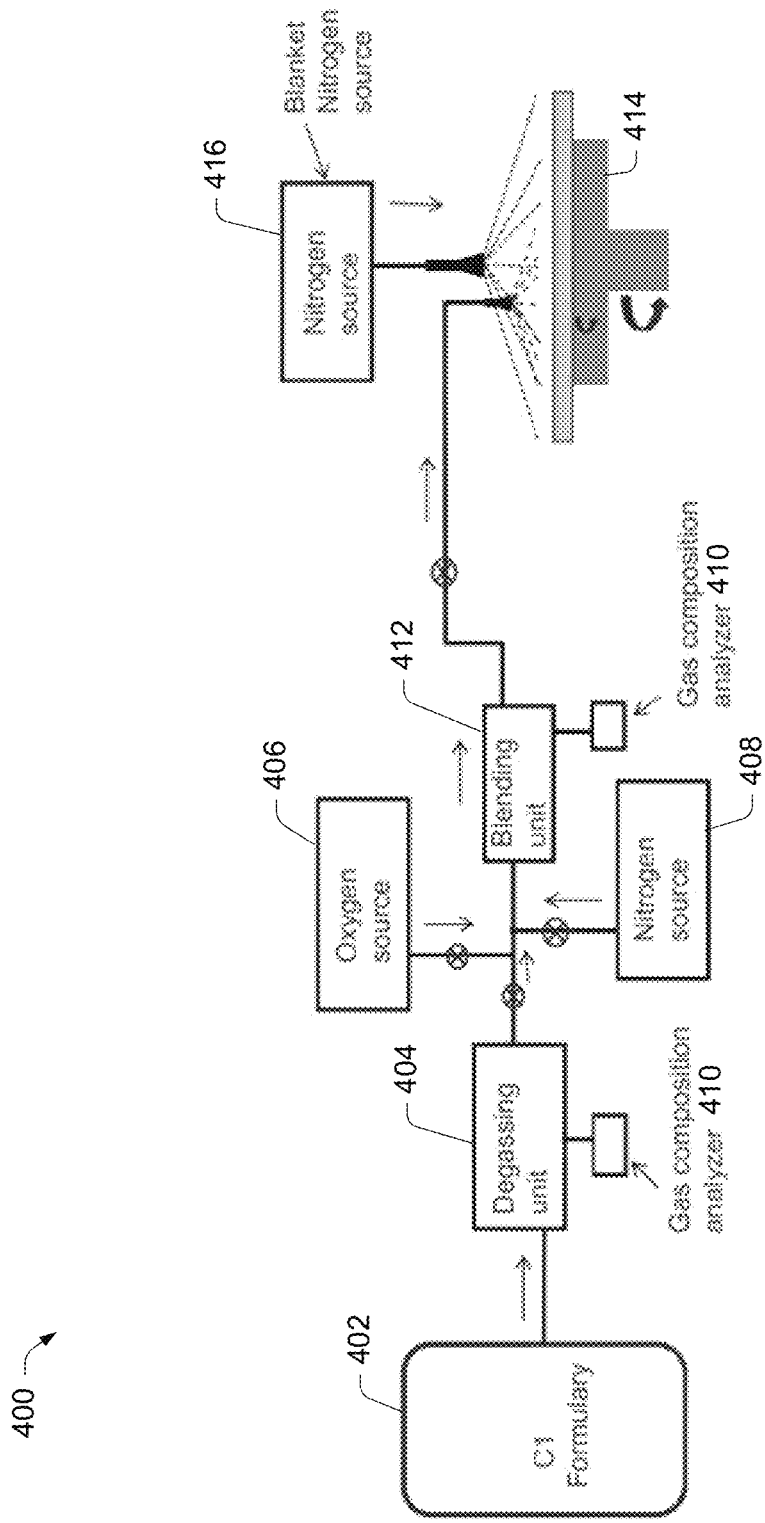
FIG. 4 is a schematically illustrated block diagram of a reactor for microelectronic element surface control.

In other embodiments, after the removal of dissolved oxygen and carbon dioxide from the first selective etchant, nitrogen gas may be incorporated into the first selective etchant by a suitable inline blending scheme, for example (see FIG. 4). Addition of nitrogen in the first selective etchant may protect the surface of the interconnect 106 during the substrate 102 removal step. For a range of first selective etchant formularies, the substrate 102 removal rate may be reduced by reducing the temperature of the first selective etchant and the removal rate may be increased by increasing the temperature of the first selective etchant. The etching rate of the first selective etchant on the substrate 102 may range between 0.01 nm/s to 5 nm/s, for example. Also, the etching selectivity between the substrate 102 and the interconnect 106 may range between 2 to 100 or even higher.

In some embodiments, the first selective etchant may be used as a surface cleaning etchant. For example, after stripping a resist layer from the surface of the substrate 102, the residual resist layer may be ashed in a plasma containing oxygen species, and any remaining residual resist layer and byproducts of the of the ashing step, including particulates, may be cleaned off the substrate 102 by applying the first selective etchant for a period of time, varying from less than 10 seconds to 300 seconds or even more, before rinsing and drying the substrate 102. In some applications, the first selective etchant may be applied to clean the surface of the substrate 102 and also the surface of the interconnect 106, to remove dirty and undesirable metal oxide from the surface of the interconnect 106 prior to the bonding operation.

In some embodiments, the process can include selectively wet etching the metallic interconnects 106 to shape or size the interconnects 106, without roughing the surface of the substrate 102. In an embodiment, a second selective etchant is used for this step in the process. The second selective etchant reduces and/or removes the desired conductive material of the interconnects 106 while maintaining a low surface roughness of the substrate 102.

For example, in the embodiment, the second selective etchant does not substantially affect the surface of the substrate 102, particularly the flatness/smoothness (nanoscale topography) of the surface. In an embodiment, the removal of the conductive material is a function of time, that is, the longer the second selective etchant is allowed to contact the metal of the interconnects 106, the more metal of the interconnects 106 is removed. Accordingly, the selective etchant is applied for a specified period of time.

In one implementation, the second selective etchant comprises a composition that removes the interconnect 106 metal (in the case of copper or copper oxide) at a controlled rate. The removal is such that the roughness (and lack of roughness) of the metal (e.g., copper) remains practically unchanged after the removal step. In one embodiment, after the metal removal step, the roughness of the metallic interconnect 106 is less than 2 nm, and in other cases, the roughness is less 0.5 nm. One unique attribute of the formulary of the second selective etchant is that the roughness of the etched metal of the interconnect(s) 106 is independent of the duration of the etch. Etching with the second selective etchant can be performed until the surfaces of the interconnects 106 are at a desired height above or below the surface of the substrate 102, to prepare the interconnects 106 for bonding.

In an implementation, the second selective etchant comprises a glycerated diluted oxidizing agent, organic acid, and deionized water, with or without a stabilizing additive. In an example, a formulary of the second selective etchant for the metallic interconnects 106 may comprise an inorganic or organic peroxide, typically less than 2% and preferably less than 0.5%. An example of the oxidizing agent may include hydrogen peroxide and urea peroxide. One or more oxidizing agents may be used in the formulary for the second selective etchant. The organic acid may comprise aliphatic or non-aliphatic organic acids, and also more than one organic acid may be used in the formulary. The organic acid content of the second selective etchant may typically be less than 2% and preferably less than 1% and preferably less than 0.1%. Examples of the organic acid may include formic acid, acetic acid, methyl sulfonic acid, and their likes. In some embodiments, mineral acids (for example, a very small amount of sulfuric acid) may be used, however, the amount should not roughen the surface of the etched metallic interconnect 106.

In one embodiment, glycerol is incorporated in the second selective etchant, where the content of glycerol may vary between 0.5 to 25% of the formulary, and preferably under 10%. In other applications, a very small amount of amide, amines, butylated hydroxyanisole (BHA), butylated hydroxytoulene, or organic carbonates may be added to the formulary. It is preferable that the total content of these additional additives, apart from glycerol, be less than 5% and preferably less than 1%.

In some embodiments, the first selective etchant may be modified to etch the surface of the interconnect(s) 106. For example, with or without the removal of dissolved oxygen and carbon dioxide from the first selective etchant, a metal oxidizing material (for example oxygen gas) may be incorporated into the first selective etchant by a suitable inline blending scheme, for instance (see FIG. 4). Addition of oxygen to the first selective etchant can increase the removal rate of the material of the interconnect 106 relative to the removal rate of the material of the substrate 102. For a range of first selective etchant formularies, the interconnect 106 material removal rate may be reduced by reducing the temperature of the oxygenated first selective etchant, and the material removal rate may be increased by increasing the temperature of the oxygenated first selective etchant. The interconnect 106 etching rate of the oxygenated first selective etchant may range between 0.01 nm/s to 5 nm/s or higher for example. Also, the etching selectivity between the interconnect 106 and the substrate 102 may range between 2 to 10 or even higher.

As disclosed in the foregoing, by modifying the oxygen content of the first selective etchant, the first selective etchant may be used to selectively remove the substrate 102, or the interconnect 106, or both, at desirable rates without roughening the surface of the substrate 102.

Figure 3:
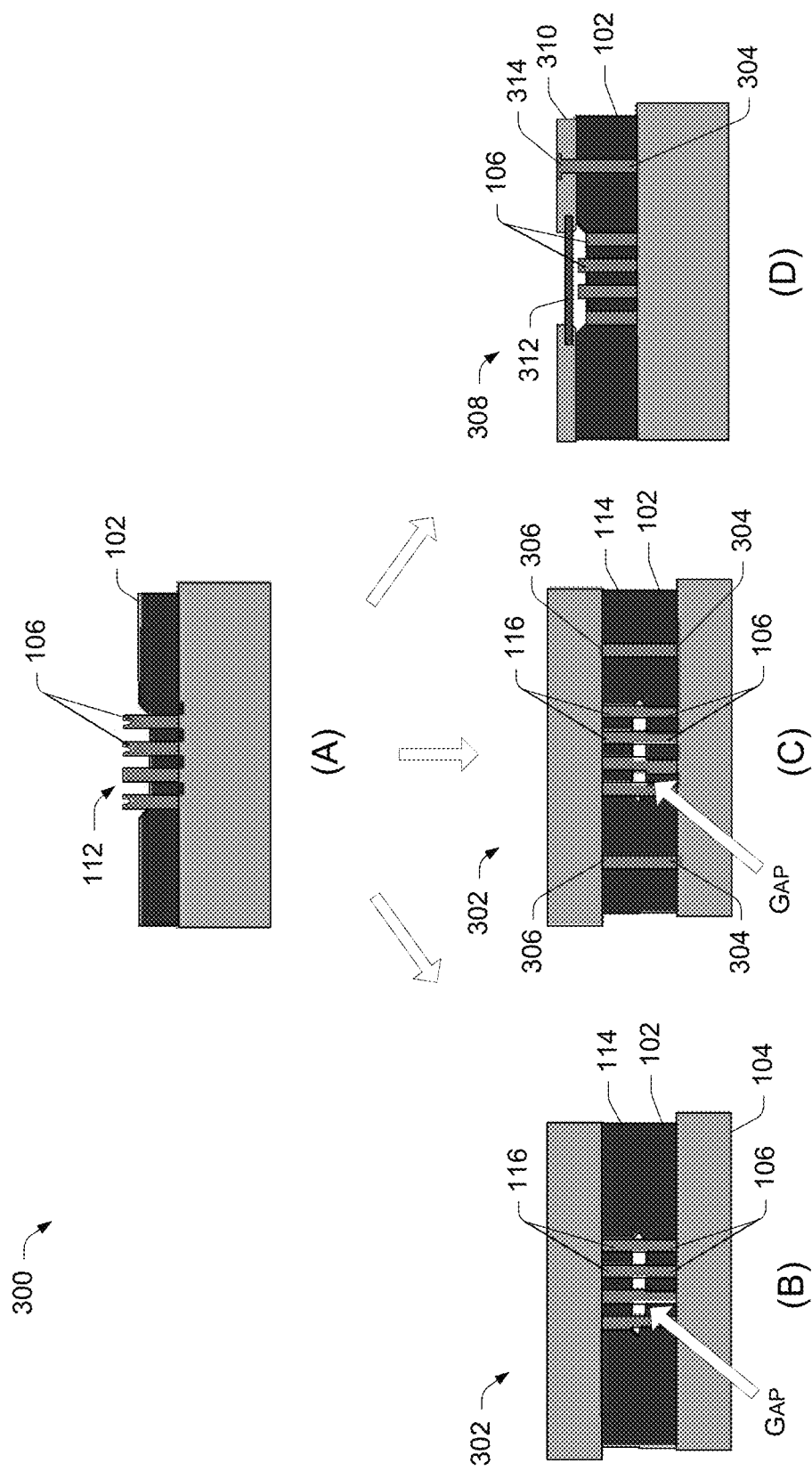
FIG. 3 is a schematically illustrated block flow diagram illustrating examples of substrate processing and repair sequences, according to various embodiments.

FIG. 3 is a schematically illustrated flow diagram illustrating an example of a substrate processing and repair sequence 300, according to various embodiments. As shown at block (A), the substrate 102 is prepared in a damascene process as described with reference to FIG. 1, and the surface of the substrate 102 is reduced as described with reference to the process 200 described in FIG. 2. The interconnects 106 protrude a preselected height above the reduced surface of the substrate 102 or above a surface of the recess 112. Blocks (B), (C), and (D) illustrate three example alternatives within the process 300 for microelectronic assemblies based on the substrate 102 of block (A).

As described above, the interconnect structures 106 may be partially selectively etched relative to the surface of the substrate 102 and/or the surface of the recess 112 (using the second selective etchant or the oxygenated first selective etchant, for example). Also in alternate embodiments, the surface of the substrate 102 may be patterned to expose the eroded portion 112 of the surface of the substrate 102. Thereafter, the substrate 102 and the interconnect structures 106 in the eroded region 112 are etched using the first and second selective etchants described earlier. For example, the desired metallic interconnect structures 106 may be partially etched with the second selective etchant (or the oxygenated first selective etchant) for 20 nm to up to 10 microns or more, to achieve the desirable height above a surface of the recess 112 without protruding above the surface of the substrate 102. Then the dielectric region adjacent to the etched metal interconnect structure 106 may be etched with the first selective etchant to the desirable depth if needed. The resist layer is stripped, and the substrate 102 is cleaned and prepared for non-adhesive bonding.

In various embodiments, as illustrated at blocks (B) and (C) of FIG. 3, an additional substrate 114 can be prepared in like manner to the substrate 102, having interconnects 116 prepared in like manner to the interconnects 106. In the embodiments, the substrate 114 is bonded to the substrate 102 (using a direct bonding technique, or the like) to form an intermediate workpiece 302 or other microelectronic element or structure, such as an interconnect device, or the like. In the embodiments, the substrate 114 is bonded to the substrate 102 such that the interconnects 116 are aligned and bonded to the interconnects 106, forming continuous conductors.

At block (B), the interconnects 106 and 116 form pass-through conductors, which also pass through the gap formed between the substrates 102 and 114, due to the erosion of one or both of the substrates 102, 114. Because the dielectric at the surfaces of the substrates 102 and/or 114 was reduced following the process 200, as described with respect to FIG. 2, the interconnects 106 and 116 are able to reach and bond with each other despite the recess 112. In an example, the interconnects 106 and 116 are in contact and may bond through pressure, heat, or other manner of fusing the conductors.

At block (C), the interconnects 106 and 116 form pass-through conductors, which also pass through the gap formed between the substrates 102 and 114. Additionally, interconnects 304 embedded within substrate 102 bond to interconnects 306 embedded within substrate 114. Note that there is less or no gap due to erosion at the bonding locations of interconnects 304 and 306. For example, interconnects 304 and 306 may have a coarser pitch or be more isolated from adjacent interconnects as compared to the plurality of interconnects 106 and 116, which may be more densely placed.

The interconnects 106 and 116 at block (C) of FIG. 3 are shown as mostly aligned, however, the process does permit some misalignment as the two interconnects 106 and 116 need only touch at one of the facing surfaces of the interconnects 106 and 116 or even along an edge of the interconnects 106 and 116. Also, as described earlier, any portion of the surface of substrate 102 or 104 or both may be masked and the conductive features and/or dielectric features may be selectively partially removed as desired to a desirable depth.

The example device 308 illustrated at block (D) of FIG. 3 may be formed from the substrate 102 configuration, prior to additional etching, as shown at block (A) of FIG. 2. Alternately, device 308 may be formed from the substrate 102 configuration, after additional etching, as shown at block (B) of FIG. 2 and block (A) of FIG. 3. In either case, a second substrate 310 is bonded to the planar surface of the substrate 102, where the second substrate 310 has a void (e.g., opening, hole, cut-out, etc.) over the eroded region 112 of the substrate 102. Additionally or alternatively, the second substrate 310 may not have an opening and may form an enclosed cavity. In such an example, the underlying semiconductor and or conductive features may form part of a MEMS device, or the like. The second substrate 310 or portions of the second substrate 310 may be permeable or impermeable to certain fluids, such as gas or liquids, or to an electric field, magnetic field, or optical radiation, and their various combinations. The second substrate 310 may include a glass, semiconductor, organic or inorganic component for support, reliability, or performance. The second substrate 310 may be directly bonded to the substrate 102 or may be glued, etc. The second substrate 310 may additionally have conductive features provided at its surface to enable a hybrid or direct bonding technique, or the like.

In various embodiments, the device 308 can be used in the illustrated configuration as a sensing device (such as a micro electro-mechanical (MEMS) device), or the like. In an example, a membrane 312 can be positioned across the void in the second substrate 310 and over the protruding metal interconnects 106 (which act as sensing conductors in this configuration). The membrane 312 may permit or prohibit light, gas, or liquid to pass through the opening in the second substrate 310.

In addition, as illustrated, the device 308 can include one or more pass-through interconnects 304 (passing through the substrate 102) which can bond to vias 314 (or the like) embedded within the second substrate 310, or may otherwise connect to circuitry outside of the substrate 102.

In some embodiments, one or more of the metallic layer in the via 314 or trench may be selectively or completely removed to form an open channel (not shown). In this form the open channel may be used or formed for non-electrical communication, for example for optical communication or optical sensing. In other applications, the device 308 may be applied or formed for electro-optical applications.

FIG. 4 illustrates an example reactor 400, or in other words a suitable inline blending scheme for the etching formulary, as discussed above. The example reactor 400 includes a receptacle 402 for containing and dispensing the formulary. In various processes, the formulary may include the first selective etchant or the second selective etchant (or both as a combination or as when they are the same etchant), for example. In other embodiments, the formulary may include other etchants or process formulary.

As discussed above, a degassing unit 404 may be used to remove oxygen and/or carbon monoxide and/or carbon dioxide from the formulary. Dissolved gasses in the formulary may be removed by a membrane process, for example, using 3M Corporation® Liqui-Cel™ Membrane Contactor or Contactors, or the like. The liquid formulary is passed through the membrane, removing the unwanted gasses (e.g., oxygen and carbon dioxide) from the formulary. This allows for control of the selectivity of the formulary, according to the selective etching desired. For example, oxygen and/or nitrogen may be added from the oxygen source 406 and/or the nitrogen source 408 as desired after the degassing. In alternate embodiments, other techniques may be used to remove unwanted gasses from the formulary that do not include a membrane.

A gas composition analyzer 410 may be employed after degassing and/or after adding and blending (for example at blending unit 412) oxygen and/or nitrogen to the formulary to observe and ensure that the formulary includes the desired concentration (or lack of) gasses of interest (e.g., oxygen, carbon dioxide, nitrogen, etc.). Adjustments or corrections may be made at the degassing unit 404, the oxygen source 406, and/or the nitrogen source 408 as desired.

As discussed above, a lower concentration of oxygen (or a lack of oxygen) in the formulary (the first selective etchant, for instance) allows for etching the substrate 102 without etching or corroding the metallic interconnect(s) 106. Also, any copper oxide of the interconnect(s) 106 is etched with a reduced oxygen concentration in the formulary, cleaning the interconnect(s) 106. Increasing the concentration of oxygen in the formulary allows the formulary to etch (e.g., dissolve) the metallic interconnect(s) 106 faster than etching the substrate 102, particularly if the interconnect(s) 106 are comprised of copper and copper oxide, or the like. Accordingly, the interconnect(s) 106 can be etched without damaging the substrate 102, using a predetermined increased oxygen concentration of the formulary, and applying this formulary for a predetermined time duration.

Increasing the volume of nitrogen from the nitrogen source 408 can be used to reduce the concentration of oxygen in the formulary, as well as reducing or stopping the flow of oxygen from the oxygen source 406. Contrarily, the flow of oxygen can be increased and/or the flow of nitrogen decreased to increase the oxygen concentration of the formulary. The pH of the formulary can be controlled in like manner, for acidic or alkaline etching as desired. For instance, in some cases (e.g., to etch copper without etching copper oxide), an alkaline etching formulary is desired.

The desired formulary is applied to the substrate 102 and/or the interconnect(s) 106, for instance while the substrate 102 is on a spinning surface 414, or the like. A blanket nitrogen source 416 may be used to reduce oxygen or other gasses from the application area of the spinning surface 414, to better control the concentration blend of the formulary as it is applied to the substrate 102 and/or the interconnect(s) 106.

In alternate implementations, other techniques may be included in the processes disclosed in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A microelectronic structure, comprising:
    a substrate comprising a generally planarized region, a recessed region, and one or more cavities, the one or more cavities being spaced from each other within the recessed region of the substrate and extending a preselected depth below a surface of the substrate, the recessed region surrounding the one or more cavities; and
    a conductive material disposed in each of the one or more cavities and forming one or more interconnect structures within the one or more cavities, a preselected portion of the one or more interconnect structures protruding from the one or more cavities above a surface of the recessed region, the conductive material extending into a portion of the recessed region.

2. The microelectronic structure of claim 1, wherein the substrate is a first substrate, the one or more cavities are one or more first cavities, and the one or more interconnect structures are one or more first interconnect structures, the microelectronic structure further comprising:
    a second substrate comprising a second generally planarized region bonded to the generally planarized region of the first substrate, and one or more second cavities, the one or more second cavities of the second substrate being spaced from each other and extending a preselected depth below a surface of the second substrate; and
    a conductive material disposed in each of the one or more second cavities and forming one or more second interconnect structures, the one or more second interconnect structures bonded to the one or more first interconnect structures of the first substrate, the recessed region of the first substrate and the surface of the second substrate forming a gap.

3. The microelectronic structure of claim 2, wherein the recessed region is a first recessed region, the microelectronic structure further comprising a second recessed region in the surface of the second substrate and extending a preselected depth below the surface of the second substrate, the second recessed region surrounding the one or more second cavities and the one or more second interconnect structures, a preselected portion of the one or more second interconnect structures protruding from the one or more second cavities above the surface of the second recessed region, the first recessed region of the first substrate and the second recessed region forming a gap.

4. The microelectronic structure of claim 2, further comprising one or more third interconnect structures extending through the first substrate, and one or more corresponding fourth interconnect structures extending through the second substrate, the one or more third interconnect structures bonded to the one or more fourth interconnect structures, and the one or more third and fourth interconnect structures disposed outside of the first recessed region of the first substrate.

5. The microelectronic structure of claim 1, wherein the substrate is a first substrate, the microelectronic structure further comprising:
    a second substrate bonded to the surface of the first substrate, the second substrate including a void disposed over the recessed region of the first substrate; and
    a membrane coupled to the second substrate and disposed across the void of the second substrate and over the one or more interconnect structures of the first substrate.

6. The microelectronic structure of claim 5, wherein the microelectronic structure comprises a micro electro-mechanical (MEMS) device.

7. The microelectronic structure of claim 5, further comprising one or more third interconnect structures extending through the first substrate, and one or more corresponding fourth interconnect structures extending through the second substrate, the one or more third interconnect structures bonded to the one or more fourth interconnect structures, and the one or more third and fourth interconnect structures disposed outside of the recessed region of the first substrate.

8. The microelectronic structure of claim 1, wherein the substrate is a first substrate, the microelectronic structure further comprising a second substrate bonded to the surface of the first substrate, the second substrate covering the recessed region of the first substrate and the one or more interconnect structures of the first substrate, and wherein the second substrate is permeable to one or both of a predefined light spectrum and one or more predefined fluids.

9. The microelectronic structure of claim 1, wherein the substrate is a first substrate, the microelectronic structure further comprising a second substrate bonded to the surface of the first substrate, the second substrate covering the recessed region of the first substrate and the one or more interconnect structures of the first substrate, and wherein the second substrate is impermeable to one or more predefined fluids.

10. The microelectronic structure of claim 1, wherein the one or more interconnect structures have a variance in surface topology of less than 2 nanometers after selective etching of the one or more interconnect structures or after selective etching of the surface of the substrate.

11. A microelectronic assembly comprising:
a first microelectronic component, comprising:
    a first substrate having a first surface and a second surface opposite the first surface, the first surface of the first substrate having a generally planarized region; and
    a plurality of first conductive interconnect structures disposed within the first substrate, a preselected portion of the first conductive interconnect structures protruding from the first surface of the first substrate; and
a second microelectronic component, comprising:
    a second substrate having a first surface and a second surface opposite the first surface, the first surface of the second substrate having a generally planarized region;
    a plurality of second conductive interconnect structures disposed within the second substrate, a preselected portion of the second conductive interconnect structures protruding from the first surface of the second substrate, the first surface of the second substrate directly bonded to the first surface of the first substrate and the second conductive interconnect structures bonded to the first conductive interconnect structures to form a plurality of conductive interconnections at a void between the first microelectronic component and the second microelectronic component, the void formed by a recess in the first surface of the first substrate, the first surface of the second substrate, or the first surface of the first substrate and the first surface of the second substrate.

12. The microelectronic assembly of claim 11, further comprising one or more third interconnect structures extending through the first substrate, and one or more corresponding fourth interconnect structures extending through the second substrate, the one or more third interconnect structures bonded to the one or more fourth interconnect structures to form one or more additional conductive interconnections not within the void between the first microelectronic component and the second microelectronic component.

13. The microelectronic assembly of claim 11, wherein the plurality of conductive interconnections extends from the second surface of the first substrate to the second surface of the second substrate.

14. The microelectronic structure of claim 3, wherein at least one of the first recessed region and the second recessed region includes multiple interconnect structures disposed therein.

15. The microelectronic structure of claim 2, wherein at least one of the one or more first interconnect structures protrudes above the surface of the first substrate or at least one of the one or more second interconnect structures protrudes above the surface of the second substrate.

* * * * *